(12) United States Patent
Kawamura

(10) Patent No.: US 10,236,049 B2
(45) Date of Patent: *Mar. 19, 2019

(54) POWER REDUCTION FOR A SENSING OPERATION OF A MEMORY CELL

(71) Applicant: Micron Technology, Inc., Boise, ID (US)

(72) Inventor: Christopher John Kawamura, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/979,178

(22) Filed: May 14, 2018

(65) Prior Publication Data
US 2018/0261272 A1    Sep. 13, 2018

Related U.S. Application Data

(63) Continuation of application No. 15/636,344, filed on Jun. 28, 2017, now Pat. No. 9,990,977, which is a continuation of application No. 15/161,952, filed on May 23, 2016, now Pat. No. 9,715,918.

(51) Int. Cl.
*G11C 11/22* (2006.01)

(52) U.S. Cl.
CPC ........ *G11C 11/2273* (2013.01); *G11C 11/221* (2013.01); *G11C 11/2253* (2013.01); *G11C 11/2257* (2013.01); *G11C 11/2259* (2013.01); *G11C 11/2275* (2013.01); *G11C 11/2297* (2013.01)

(58) Field of Classification Search
CPC .............. G11C 11/2273; G11C 11/221; G11C 11/2257; G11C 11/2275; G11C 11/2297
See application file for complete search history.

(56) References Cited

U.S. PATENT DOCUMENTS

| | | | |
|---|---|---|---|
| 6,301,145 B1 | 10/2001 | Nishihara | |
| 6,809,951 B2 | 10/2004 | Yamaguchi | |
| 7,215,595 B2 | 5/2007 | Kiehl | |

(Continued)

OTHER PUBLICATIONS

ISA/KR, International Search Report and Written Opinion of the International Searching Authority, Int'l. Appl. No. PCT/US2017/030371, dated Aug. 3, 2017, Korean Intellectual Property Office, Daejeon, Republic of Korea, 14 pgs.

*Primary Examiner* — Pho M Luu
(74) *Attorney, Agent, or Firm* — Holland & Hart LLP

(57) ABSTRACT

Methods, systems, and devices for operating a ferroelectric memory cell or cells are described. A memory device may leverage non-volatile memory properties of a ferroelectric capacitor—e.g., that a ferroelectric capacitor may remain polarized at one of two states without a voltage applied across the ferroelectric capacitor—to activate a subset of sensing components corresponding to multiple memory cells with a common word line. For example, a first and second set of memory cells with a common word like may be selected for a read operation. A first set of sensing components corresponding to the first set of memory cells may be activated for the read operation, and a second set of sensing components that correspond to the second set of memory cells may be maintained in a deactivated state.

20 Claims, 8 Drawing Sheets

(56) References Cited

U.S. PATENT DOCUMENTS

| | | | |
|---|---|---|---|
| 7,397,687 B2 | 7/2008 | Shiga et al. | |
| 7,974,134 B2 | 7/2011 | Zhang et al. | |
| 7,986,579 B2 | 7/2011 | Akaogi | |
| 8,189,393 B2* | 5/2012 | Lee | G11C 16/3459 |
| | | | 365/185.22 |
| 8,472,267 B2 | 6/2013 | Tanpure et al. | |
| 8,493,784 B2* | 7/2013 | Kang | G11C 11/5628 |
| | | | 365/185.03 |
| 9,202,579 B2 | 12/2015 | Hsiung et al. | |
| 9,240,229 B1 | 1/2016 | Oh et al. | |
| 9,543,016 B1* | 1/2017 | Jin | G11C 16/10 |
| 9,715,918 B1* | 7/2017 | Kawamura | G11C 11/2275 |
| 9,990,977 B2* | 6/2018 | Kawamura | G11C 11/2275 |

* cited by examiner

POWER REDUCTION FOR A SENSING OPERATION OF A MEMORY CELL

CROSS REFERENCE

The present Application for Patent is a continuation of U.S. patent application Ser. No. 15/636,344 by Kawamura, entitled "Power Reduction For A Sensing Operation Of A Memory Cell," filed Jun. 28, 2018, now U.S. Pat. No. 9,990,977, issued on Jun. 5, 2018, which is a continuation of U.S. patent application Ser. No. 15/161,952 by Kawamura, entitled "Power Reduction for a Sensing Operation of a Memory Cell," filed May 23, 2016, now U.S. Pat. No. 9,715,918, issued on Jul. 25, 2017, each of which is assigned to the assignee hereof, and each of which is expressly incorporated by reference in its entirety herein.

BACKGROUND

The following relates generally to memory devices and more specifically to reducing the power consumption associated with read operations for a ferroelectric memory cell.2. SPEC Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., flash memory) can store data for extended periods of time even in the absence of an external power source. Volatile memory devices (e.g., DRAM) may lose their stored state over time unless they are periodically refreshed by an external power source. A binary memory device may be an example of a volatile memory device and may store a logic state by charging or discharging a capacitor. A charged capacitor, however, may become discharged over time through leakage currents, resulting in the loss of the stored information. Furthermore, reading the state stored in a capacitor is destructive and the memory device must rewrite the initial state to the capacitor at the end of the read operation. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. When performing a read operation, an FeRAM device may activate the sensing components corresponding to each memory cell with a common word line. But firing each memory cell may result in increased power consumption.

BRIEF DESCRIPTION OF THE DRAWINGS

The disclosure herein refers to and includes the following figures.

DETAILED DESCRIPTION

A ferroelectric memory device may leverage non-volatile memory properties of a ferroelectric capacitor—e.g., that a ferroelectric capacitor may remain polarized at one of two states without a voltage applied across the ferroelectric capacitor—to activate a subset of sensing components corresponding to multiple memory cells using a common access line (e.g., a word line), conserving power. A set of memory cells, associated with a common word line, may be selected for a read operation. The read operation may be performed to extract information stored by some memory cells of the set of memory cells without disturbing information stored in other memory cells of the set, even though each memory cell in the set may share a word line.

By way of example, to read memory cells of a set, digit lines corresponding to the memory cells to be read may be virtually grounded before the read operation. A voltage may be applied to top cell plate of memory cells to be read. This may cause a voltage difference across ferroelectric capacitors of the cells to be read, so the ferroelectric capacitors may release charge onto the corresponding digit lines during the read operation. To prevent the ferroelectric capacitors of other memory cells—i.e., those not intended to be read— from releasing charge, a voltage across those ferroelectric capacitors may be held at or near zero. For instance, digit lines corresponding to unread memory cells may be maintained at a voltage that is at or near a voltage applied to a top cell plate of the ferroelectric capacitors of the unread memory cells. Accordingly, the ferroelectric capacitors of the unread memory cells may retain their stored logic states during a read operation of other cells on the same word line, and the sensing components associated with the unread memory cells may be maintained in a deactivated state, which may reduce power consumption.

By contrast, for a DRAM memory cell, selecting a memory cell for a read operation may disturb each memory cell that shares a word line. As described further below, the sensing components may then be used to restore ("write-back") the initial logic state of the disturbed memory cells, drawing power to facilitate the write-back.

Features of the disclosure introduced above are further described below in the context of a memory array. Specific examples are then described with reference to a circuit that supports a reduced power sensing architecture. These and other features of the disclosure are further illustrated by and described with reference to apparatus diagrams, system diagrams, and flowcharts that relate to a reduced power sensing scheme.

Figure 1:
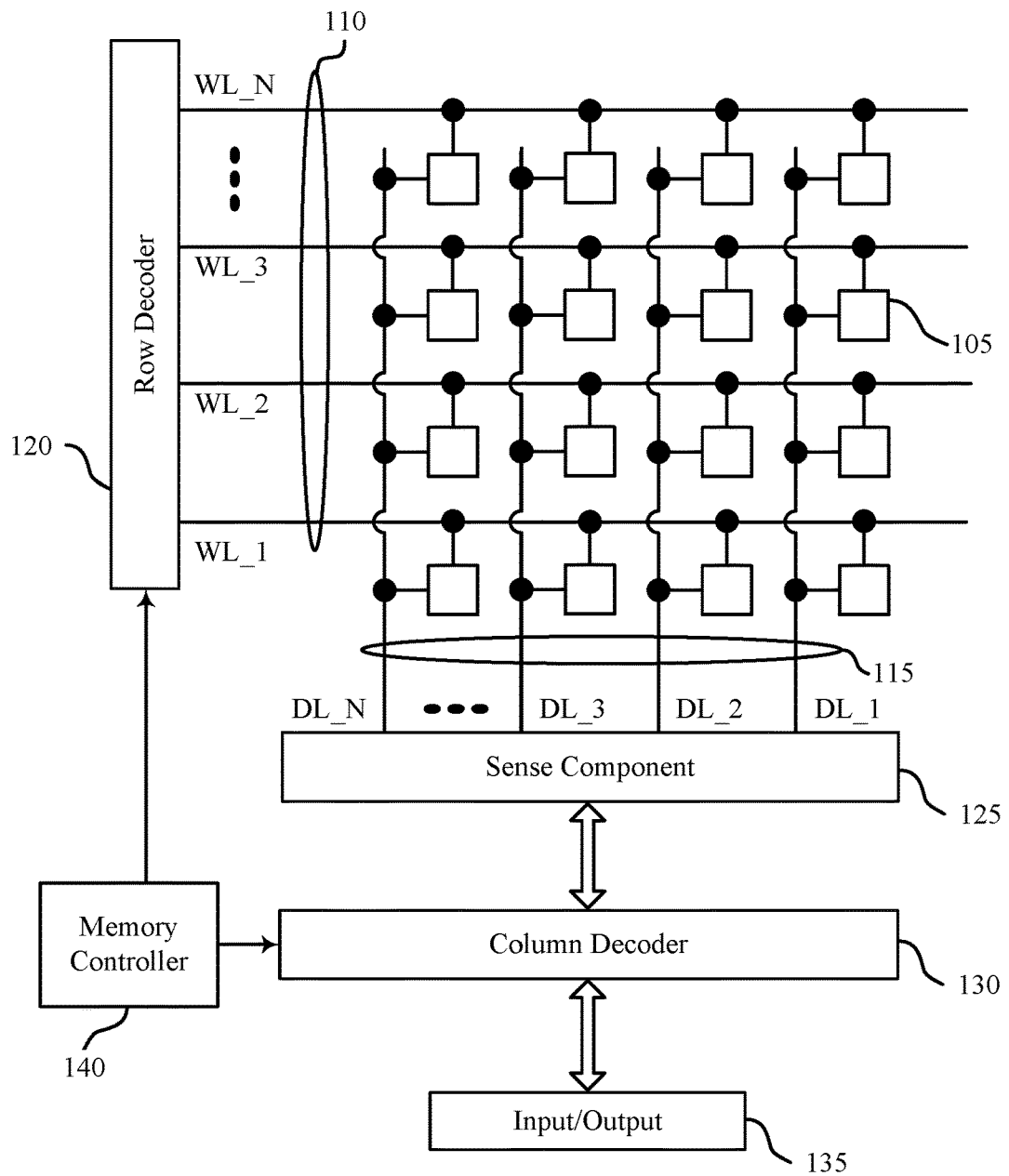
FIG. 1 illustrates an example memory array that supports a reduced-power sensing scheme in accordance with various embodiments of the present disclosure.

FIG. 1 illustrates an example memory array 100 that supports a reduced-power sensing scheme in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic "0" and a logic "1." In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate access line, which may also be referred to as a word line 110 and digit line 115 from WL_1 to WL_N and DL_1 to DL_N, respectively. Activating or selecting a word line 110 or a digit line 115 may include applying a voltage to the respective line. In some cases, a digit line 115 may be referred to as a bit line. Word lines 110 and digit lines 115 are made of conductive materials. For example, word lines 110 and digit lines 115 may be made of metals, such as copper, aluminum, gold, tungsten, or the like. According to the example of FIG. 1, each row of memory cells 105 are connected to a single word line 110, and each column of memory cells 105 are connected to a single digit line 115. By activating (e.g., applying a voltage to) one of the word lines 110 and one of the digit lines 115, a single memory cell 105 may be accessed at their intersection. The intersection of a word line 110 and digit line 115 may be referred to as an address of a memory cell.

In some architectures, the logic-storing device of a cell (e.g., a capacitor) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. Thus, by activating a word line 110 and a digit line 115, memory cell 105 may be accessed. For example, the memory array 100 may access memory cell 105 by activating DL_1 and WL_3.

Upon accessing, memory cell 105 may be read, or sensed, by sensing component 125 to determine the stored state of memory cell 105. For example, after accessing the memory cell 105, the ferroelectric capacitor of memory cell 105 may discharge onto the corresponding digit line 115, inducing a voltage on the digit line 115. The voltage of the digit line 115 may be input to the sensing component 125, where the voltage of the digit line 115 may be compared with a reference voltage. For a memory cell 105 with a ferroelectric capacitor, reading the memory cell may include biasing—e.g., applying a voltage to—a plate of the ferroelectric capacitor. This may be referred to as a "moving plate" scheme. In some cases, a fixed voltage may be applied to the plate of the ferroelectric capacitor, and reading the memory cell may include virtually grounding a digit line 115 that is in electronic communication with the ferroelectric capacitor prior to performing a read operation. This may be referred to as a "fixed plate" scheme.

Sensing component 125 may include various transistors or amplifiers to detect and amplify a difference in the signals, which may be referred to as latching. Sensing component 125 may include a sense amplifier that receives and compares a voltage of a digit line 115 and a reference voltage. The output of the sense amplifier may be driven to a higher (e.g., a positive) or lower (e.g., negative or ground) supply voltage based at least in part on the comparison. For instance, if digit line 115 has a higher voltage than the reference voltage, then the sense amplifier output may be driven to a positive supply voltage. In some cases, the sense amplifier may additionally drive the output of the digit line 115 to the supply voltage. Sensing component 125 may then latch the output of the sense amplifier or the voltage of digit line 115, or both, which may be used to determine that the stored state in memory cell 105 was a logic "1." Alternatively, if digit line 115 has a lower voltage than the reference voltage, the sense amplifier output may be driven to a negative or ground voltage. Sensing component 125 may similarly latch the output of the sense amplifier to determine that the stored state in memory cell 105 was a logic "0." The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state, and re-write or refresh operation—also referred to as a write-back operation—may be performed to return the original logic state to memory cell 105. In DRAM, for example, a capacitor may be initialized with one of two states, a logic "0" or a logic "1." For instance, a logic "0" may be associated with a negative or zero voltage across a capacitor, and a logic "1" may be associated with a positive voltage across the capacitor. A DRAM read operation may include providing a voltage that is half of a sensing voltage to a digit line 115 that is in electronic communication with a first plate (e.g., a bottom plate) of a capacitor and floating the digit line 115 prior to accessing a memory cell 105. Upon accessing the memory cell 105, and due to the voltage of the first plate and the voltage across the capacitor, the capacitor may be partially or completely discharged onto or be charged from the digit line 115, depending on the stored state. Therefore, accessing the memory cell may corrupt or disturb the stored logic state, and the logic state may be re-written after a sense operation.

To re-write the logic state, a sensing component 125 may apply a high voltage (e.g., a full sense voltage) or a low voltage (e.g., virtual ground) to the first plate of the capacitor, while a voltage of the second plate (e.g., a top plate) is maintained at a fixed voltage (e.g., half of the sensing voltage). During this period, the voltage applied across the capacitor may correspond to either a logic "0" or a logic "1," and the memory cell may be isolated from the digit line 115 to store the logic state. In some cases, a single word line 110 is in electronic communication with multiple memory cells 105, and activating the single word line 110 for a read operation may result in the discharging or charging of the memory cells 105 in the row. So several or all memory cells 105 in the row may need to be re-written. In a DRAM device, sensing components 125 that corresponding to accessed memory cells 105, may be used to re-write the initially stored logic states back to the memory cells 105 accessed by the read operation.

Some memory architectures, including DRAM, may also lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., tens of refresh operations per second for DRAM—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. Ferroelectric memory cells 105 may, however, have beneficial properties that may result in improved performance relative to other memory architectures. For example, because ferroelectric memory cells 105 tend to be less susceptible to degradation of stored charge, a memory array 100 that employs ferroelectric memory cells 105 may require fewer or no refresh operations, and may thus require less power to operate.

Figure 3:
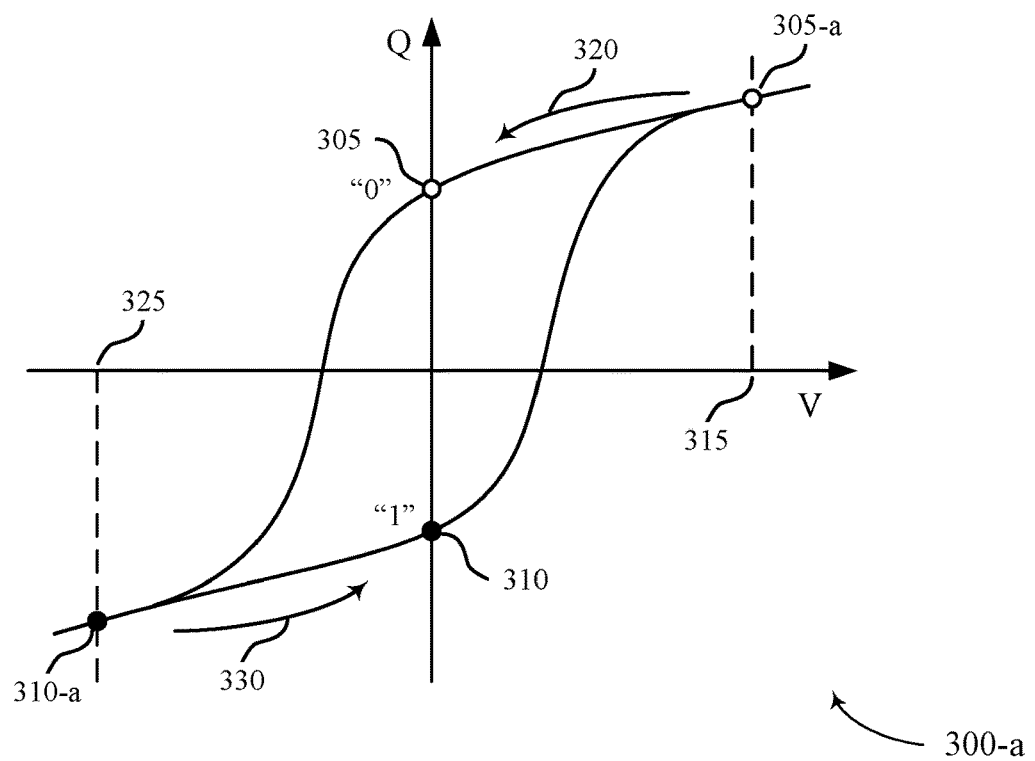
FIG. 3 illustrates example hysteresis curves for a ferroelectric memory cell that supports a reduced-power sensing scheme in accordance with various embodiments of the present disclosure.
Figure 3:
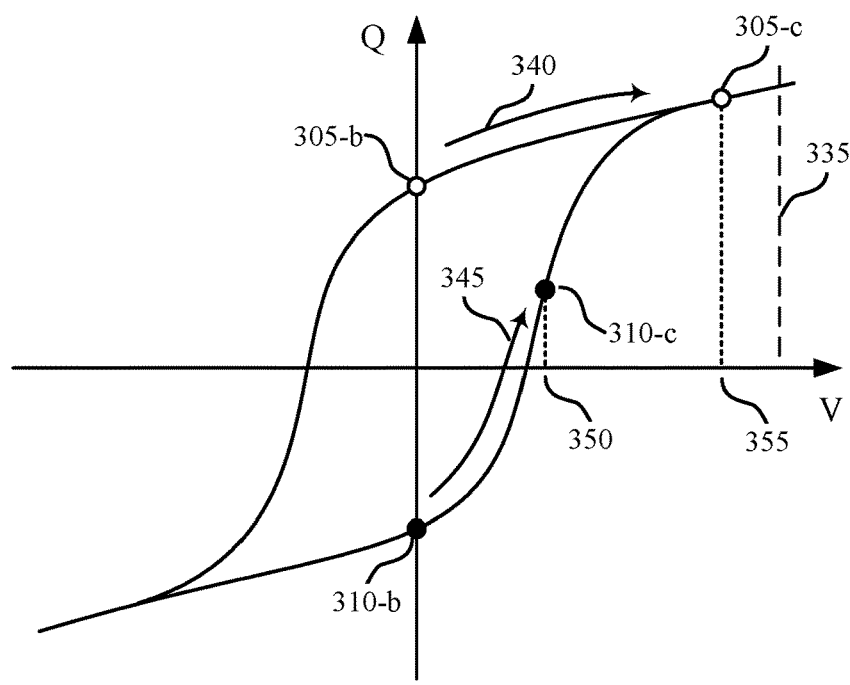

In some examples, the non-volatile properties of a ferroelectric capacitor may be used to maintain the state stored by a ferroelectric memory cell 105, while a voltage is applied to a word line 110 used by a ferroelectric memory cell 105. For instance, a memory array 100 may leverage the property of a ferroelectric capacitor to retain a polarization charge, and therefore a stored logic state while a zero voltage is applied across the ferroelectric capacitor during a read operation, as illustrated in FIG. 3. With regard to a ferroelectric memory cell 105 that uses a fixed plate scheme, a fixed voltage may be applied to a first plate ("top" plate) of a ferroelectric capacitor associated with the ferroelectric memory cell 105, and a corresponding digit line 115 may be charged to a voltage whose magnitude is at or near the fixed voltage. The corresponding digit line 115 may be in electronic communication with a second plate ("bottom" plate) of the ferroelectric capacitor. A voltage may then be applied to a word line 110 that is used by and common to the ferroelectric memory cell 105 and other ferroelectric memory cells 105.

In some cases, a read operation may be initiated in order to read a subset of the ferroelectric memory cells 105; however, as discussed above, applying a voltage to a word line 110 may result in each of the ferroelectric memory cells 105 using the word line 110 being accessed. For the subset of the ferroelectric memory cells 105 intended to be read, the corresponding digit lines 115 may be virtually grounded before applying the voltage to the word line 110. For other ferroelectric memory cells 105 that are not intended to be read, the corresponding digit lines may be maintained at the fixed voltage applied to the first ("top") plate of the ferroelectric capacitor. Therefore, when the unread ferroelectric memory cells 105 are accessed by the read operation, a zero voltage differential—i.e., the voltage of the top plate minus the voltage of the bottom plate—may be applied across the associated ferroelectric capacitors.

Thus, the ferroelectric capacitors associated with the second set of ferroelectric memory cells 105 may refrain from sharing charge with the digit lines 115. And due to the ability of a ferroelectric capacitor to maintain at least two different logic states while a zero voltage is applied across the ferroelectric capacitor, the stored logic states may be maintained. By contrast, a capacitor used by a DRAM memory cell 105 may not maintain its stored state at a zero voltage differential and therefore may need to be re-written after each read operation on the word line. Because the logic state does not need to be written-back to a ferroelectric memory cell after each read operation, the sensing components 125 corresponding to the associated ferroelectric capacitor may be maintained in a deactivated state to conserve power.

The memory controller 140 may control the operation (e.g., read, write, re-write, refresh, etc.) of memory cells 105 through the various components, such as row decoder 120, column decoder 130, and sensing component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, memory controller 140 may be used to activate a first set of switching components 125, a second set of switching components 125, or both. For instance, in some cases, a set of memory cells 105 using a common word line 110 may be grouped into a first and second set of memory cells 105. Memory controller 140 may be used to select the first set of memory cells 105 and the second set of memory cells 105 for a read operation using the common word line 110; but may individually activate a corresponding first and second set of sensing components 125. That is, memory controller 140 may activate the first set of sensing components 125 for the first set of memory cells 105, while maintaining the second set of sensing components corresponding to the second set of memory cells in a deactivated state during the read operation. Operating a portion of the sensing components 125 corresponding to the first and second set of memory cells 105 may conserve power and may be used to reduce noise in memory array 100, such as pattern noise, cross-talk between digit lines 115, and the like.

Figure 2:
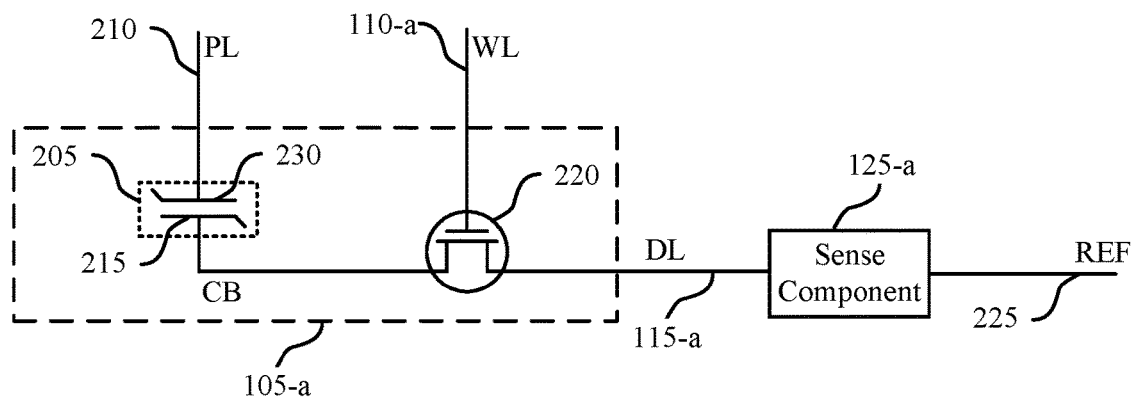
FIG. 2 illustrates an example circuit of a memory cell that supports a reduced-power sensing scheme in accordance with various embodiments of the present disclosure.

FIG. 2 illustrates an example circuit 200 of a memory cell that supports a reduced power sensing scheme in accordance with various embodiments of the present disclosure. Circuit 200 includes a memory cell 105-a, word line 110-a, digit line 115-a, and sensing component 125-a, which may be examples of a memory cell 105, word line 110, which may also be referred to as access line, digit line 115, and sensing component 125, respectively, as described with reference to FIG. 1.

Memory cell 105-a may include a logic storage component, such as capacitor 205, which has a first plate and a second plate that are capacitively coupled. The first plate may be referred to as cell plate 230 and the second plate may be referred to as cell bottom 215. In some examples, the orientation of the capacitor may be flipped without changing the operation of memory cell 105-a; that is, the first plate may correspond to cell bottom 215 and the second plate may correspond to cell plate 230. In the example of FIG. 2, cell plate 230 may be accessed via plate line 210 and cell bottom 215 may be accessed via digit line 115-a. Also, in the example of FIG. 2, the terminals of capacitor 205 are separated by a ferroelectric material, and memory cell 105-a is referred to as a ferroelectric memory cell 105-a in the following discussion. As described above, various states may be stored by charging or discharging capacitor 205, i.e., polarizing the ferroelectric material of capacitor 205. The total charge needed to polarize capacitor 205 may be referred to as the remnant polarization (PR) value, and a voltage of capacitor 205 at which half the total charge of capacitor 205 is reached may be referred to as the coercive voltage (VC).

The stored state of capacitor 205 can be read or sensed by operating various elements represented in circuit 200. Capacitor 205 may be in electronic communication with digit line 115-a. For example, capacitor 205 can be isolated from the digit line 115-a when selection component 220 is deactivated, and capacitor 205 can be connected to digit line 115-a when selection component 220 is activated to select the ferroelectric memory cell 105-a. In other words, ferroelectric memory cell 105-a may be selected using selection component 220 that is in electronic communication with ferroelectric capacitor 205, where ferroelectric memory cell 105-a includes selection component 220 and ferroelectric capacitor 205. In some cases, selection component 220 is a transistor and its operation is controlled by applying a voltage to the transistor gate, where the voltage magnitude is greater than the threshold magnitude of the transistor.

Word line 110-a may activate selection component 220; for example, a voltage applied to word line 110-a is applied to the transistor gate, connecting capacitor 205 with digit line 115-a. Alternatively, the positions of selection component 220 and capacitor 205 may be switched, such that selection component 220 is between plate line 210 and cell plate 230 and such that capacitor 205 is between digit line 115-a and the other terminal of selection component 220. In such cases, selection component 220 may remain in electronic communication digit line 115-a to capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. For example, to sense the state that is stored by ferroelectric capacitor 205 during a read, plate line 210 may be ramped to a voltage in a moving plate scheme. In some cases, digit line 115-a is virtually grounded and subsequently isolated from the virtual ground before ramping the voltage to plate line 210 and applying a voltage to word line 110-a to select ferroelectric memory cell 105-a. Selecting ferroelectric memory cell 105-a may result in a voltage difference across capacitor 205—e.g., the voltage of plate line 210 minus the voltage of digit line 115-a. The resulting voltage difference may yield a change in the stored charge on capacitor 205 depending on the initial state of capacitor 205—e.g., whether the initial state stored a logic "1" or a logic "0." This change in stored charge may induce a voltage on digit line 115-a based on the resulting charge stored on capacitor 205. The induced voltage on digit line 115-a may then be compared to a reference (e.g., a voltage of reference line 225) by sensing component 125-a in order to determine the stored logic state in ferroelectric memory cell 105-a.

Alternatively (e.g., in a fixed plate scheme), a non-variable voltage may be applied to plate line 210—e.g., the fixed voltage may be half of the voltage supplied to sensing component 125-a. That is, the voltage applied to plate line 210 may be maintained at a pre-determined voltage. In such cases, inactive digit lines, such as digit line 115-a, may be charged to a voltage that is associated with (e.g., the same as or near) the fixed voltage applied to plate line 210. In order to sense the logic state stored by capacitor 205, digit line 115-a may be virtually grounded and subsequently isolated from virtual ground prior to applying a voltage to word line 110-a. As above, applying the voltage to word line 110-a may establish a conductive path between cell bottom 215 and digit line 115-a resulting in a voltage difference across capacitor 205—e.g., the fixed voltage of cell plate 230 minus the voltage of digit line 115-a. Capacitor 205 may then charge share with digit line 115-a and a voltage may be induced. In some cases, this induced voltage may be compared with a reference voltage at sensing component 125-a.

In some examples, word line 110-a may be used to select multiple ferroelectric memory cells including ferroelectric memory cell 105-a for a read operation. The read operation may be triggered for the purpose of reading a subset of the selected ferroelectric memory cells. And in some examples, memory cell 105-a may not be included in the subset of selected ferroelectric memory cells. Accordingly, digit line 115-a may be maintained at or near the voltage applied to plate line 210 to maintain the polarization state of capacitor 205 and retain the stored logic state. Furthermore, since the logic state of memory cell 105-a may be undisturbed during the read operation, a memory device may conserve power by activating only the sensing components associated with the subset of the selected ferroelectric memory cells, as described in more detail below.

Although the above techniques have largely been discussed in the context of a fixed plate scheme, these principles and the following discussion herein may similarly be applied to a moving plate scheme. For instance, the voltage of digit line 115-a may be ramped in unison with and at the same magnitude of a voltage applied to plate line 210 for a read operation. Alternatively, the voltage of digit line 115-a may be biased at the peak of the ramped voltage applied to plate line 210.

The specific sensing scheme or process employed to read cell 105-a may take many forms. In one example, digit line 115-a may have an intrinsic capacitance and develop a non-zero voltage as capacitor 205 charges or discharges in response to the voltage applied to plate line 210. The intrinsic capacitance may depend on physical characteristics, including the dimensions, of digit line 115-a. Digit line 115-a may connect many ferroelectric memory cells 105, so digit line 115-a may have a length that results in a non-negligible capacitance (e.g., on the order of picofarads (pF) or femtofarads (fF)). The subsequent voltage of digit line 115-a may depend on the initial logic state of capacitor 205, and sensing component 125-a may compare this voltage to a voltage on reference line 225 provided by a reference component. Other sensing processes that take advantage of this change in charge may also be used.

To write ferroelectric memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 using plate line 210 and controlling the voltage of cell bottom 215 using digit line 115-a. To write a logic "0," cell plate 230 may be taken high, that is, a positive voltage may be applied to plate line 210, and cell bottom 215 may be taken low—e.g., virtually grounded using digit line 115-a. The opposite process is performed to write a logic "1"—i.e., cell plate 230 may be taken low and cell bottom 215 may be taken high.

In a scheme in which a fixed voltage is applied to plate line 210, selection component 220 may be activated and a voltage applied to digit line 115-a may be used to control the voltage of cell bottom 215 for a write operation. In some cases, the fixed plate voltage may be between the supply voltages of sensing component 125-a, and sensing component 125-a may be used to drive the voltage of digit line 115-a to a voltage the high or the low (e.g., a zero or negative) supply voltage. For instance, to write a logic "0," cell bottom 215 may be taken low, that is, the voltage of digit line 115-a may be driven to the low supply voltage. And to write a logic "1," cell bottom 215 may be taken high—e.g., the voltage of digit line 115-a may be driven to the high supply voltage. Read and write operations of capacitor 205 may account for the non-linear properties associated with a ferroelectric device.

FIG. 3 illustrates examples of such non-linear properties with hysteresis curves 300-a and 300-b for a ferroelectric memory cell that supports a reduced power sensing scheme in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge will accumulate at the terminal. Likewise, if the ferroelectric material has a positive polarization, negative charge will accumulate at the terminal. Additionally, it should be understood that the voltages in hysteresis curves 300 represent a voltage difference across the capacitor and are directional. For example, a positive voltage may be applied by applying a positive voltage to the terminal in question (e.g., cell plate 230) and maintaining the second terminal at ground (e.g., cell bottom 215). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic "0" and charge state 310 represents a logic "1." In some examples, the logic values of the respective charge states may be reversed to accommodate other schemes for operating a ferroelectric memory cell.

A logic "0" or "1" may be written to the ferroelectric memory cell by controlling the electric polarization of the ferroelectric material, and thus the charge on the capacitor terminals, by applying voltage. For example, applying a net positive voltage 315 across the capacitor—e.g., applying a greater voltage to cell plate 230 than to cell bottom 215 as described with reference to FIG. 2—results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes varies depending on whether charge state 305-b or 310-b was initially stored. For example, hysteresis curve 300-b illustrates two possible stored charge states 305-b and 310-b. Voltage 335 may be applied to the cell plate (e.g., cell plate 230 with reference to FIG. 2) of the capacitor. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c may depend on a number of factors, including the specific sensing operation and circuitry.

In some cases, the final charge may depend on the intrinsic capacitance of the digit line of a ferroelectric memory cell. For example, if the capacitor is electrically connected to the digit line and voltage 335 is applied, the voltage of the digit line may rise due to its intrinsic capacitance, and the voltage measured at a sensing component may depend on the resulting voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage across the capacitor, voltage 350 or voltage 355, may be different and may depend on the initial state of the capacitor. With regard to a moving plate scheme, voltage 335 may be ramped from a zero voltage to a read voltage, triggering the capacitor to share its charge with a corresponding digit line.

A fixed plate scheme may apply a constant voltage 335, and the corresponding digit line may be virtually grounded prior to accessing the capacitor, triggering the capacitor to share its charge with the corresponding digit line. As discussed above, the capacitor may retain one of two logic states associated with charge state 305-*b* or 310-*b*, while a zero voltage is applied across the capacitor. Therefore, if a voltage across the capacitor is maintained at a zero voltage during a read operation, the stored state may not be destroyed during the read operation. In some examples, a ferroelectric memory device may take advantage of this characteristic to read a first subset of ferroelectric memory cells selected using a common word line. For example, a ferroelectric memory device may refrain from virtually grounding a digit line corresponding to a second subset of the selected ferroelectric memory cells so that a zero voltage difference is maintained across the capacitor. So the capacitor may maintain its initial charge state (e.g., charge state 305-*b* or 310-*b*), and therefore, the memory device may refrain from activating a set of sensing components corresponding to the second subset of the selected ferroelectric memory cells, conserving power.

By comparing the difference of the voltage applied to the cell plate (e.g., voltage 335) and the voltage across the capacitor (e.g., voltage 350 or voltage 355) to a reference voltage, the initial state of the capacitor may be determined. As can be understood by reference to FIG. 2, the voltage of the digit line may be represented as the difference of the voltage applied to plate line 210 and the resulting voltage across the capacitor 205. As discussed above, the voltage of the digit line is based at least in part on the change in charge stored at the capacitor, and the change in charge is associated with the magnitude of the voltage that is applied across the capacitor. In some examples, the reference voltage may be an average of the digit line voltages that result from voltages 350 and 355, and, upon comparison, the sensed digit line voltage may be determined to be higher or lower than the reference voltage. A value of the ferroelectric cell (i.e., a logic "0" or "1") may then be determined based on the comparison.

As discussed above, a ferroelectric memory cell, however, may maintain the initial logic state after a read operation. For example, if charge state 305-*b* is stored and the read operation performed, the charge state may follow path 340 to charge state 305-*c*, and after removing voltage 335, the charge state may return to initial charge state 305-*b*, for example, by following path 340 in the opposite direction.

Figure 4:
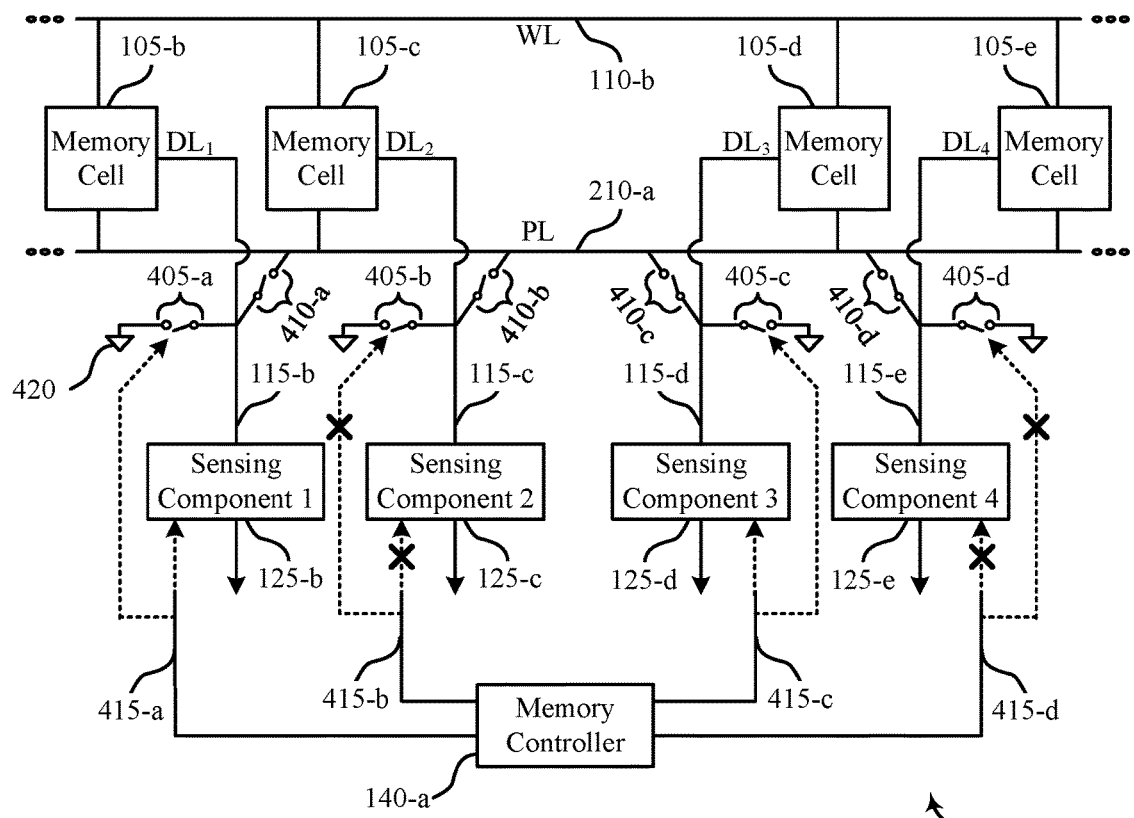
FIG. 4 illustrates an example circuit that supports a reduced-power sensing scheme in accordance with various embodiments of the present disclosure.

FIG. 4 illustrates an example circuit 400 that supports a reduced power sensing scheme in accordance with various embodiments of the present disclosure. Circuit 400 includes ferroelectric memory cells 105-*b* to 105-*e*, word line 110-*b* (which may also be referred to as access line 110-*b*), digit lines 115-*b* to 115-*e*, sensing components 125-*b* to 125-*e*, and memory controller 140-*a* which may be examples of a ferroelectric memory cell 105, word line 110, digit line 115, sensing component 125, and memory controller 140-*a*, respectively, as described with reference to FIGS. 1 and 2. Circuit 400 may also include plate line 210-*a*, which may be an examples of a plate line 210 as described with reference to FIG. 2. Circuit 400 also includes switching components 405-*a* to 405-*d*, plate switching components 410-*a* to 410-*d*, control lines 415-*a* to 415-*d*, and virtual ground 420.

Ferroelectric memory cells 105-*b* to 105-*e* may each include a logic storing component, such as a ferroelectric capacitor, and a selection component, as described with reference to FIG. 2. Ferroelectric memory cells 105-*b* to 105-*e* may also be in electronic communication with plate line 210-*a*, which may be used to bias a cell plate (e.g., cell plate 230 as described with reference to FIG. 2) of the ferroelectric capacitor for each of ferroelectric memory cells 105-*b* to 105-*e*. In some cases, a predetermined voltage may be constantly applied to plate line 210-*a*, for example in the case of a memory device using a fixed plate scheme. Each of ferroelectric memory cells 105-*b* to 105-*e* may be in electronic communication with word line 110-*b*, which may be used to access ferroelectric memory cells 105-*b* to 105-*e* (e.g., for a read operation). For instance, by applying a voltage to word line 110-*b*. In some cases, the voltage applied to word line 110-*b* may establish a conductive path between the cell bottom (e.g., cell bottom 215 as described with reference to FIG. 2) of the ferroelectric capacitor for each of ferroelectric memory cells 105-*b* to 105-*e* and the corresponding digit lines 115-*b* to 115-*e*.

Digit lines 115-*b* to 115-*e* may each have intrinsic capacitances, which may not be electrical devices—i.e., may not be two-terminal capacitors—but instead may depend on physical characteristics of digit lines 115-*b* to 115-*e* (e.g., trace width, trace length, etc.). Digit lines 115-*b* to 115-*e* may each be connected to virtual ground 420 via switching components 405-*a* to 405-*d*, respectively. Virtual ground 420 may act as a common reference for circuit 400 and may also be referred to as ground or associated with a zero voltage, although, the virtual ground may float to a voltage that is different than (e.g., greater or less than) zero volts when referenced to an earth ground. In some cases, digit lines 115-*b* to 115-*d* are virtually grounded prior to performing a sensing operation. Digit lines 115-*b* to 115-*e* may also be connected to plate line 210-*a* via plate switching components 410-*a* to 410-*d*, respectively. Connecting digit lines 115-*b* to 115-*e* to plate line 210-*a* may bias digit line 115-*b* to 115-*e* at the voltage of plate line 210-*a*. Additionally or alternatively, a switching component between a first and a second digit line may be used to produce a voltage that is at or near the voltage of plate line 210-*a*. For instance, a digit line, such as digit lines 115-*b* to 115-*e*, may be driven to a low voltage (e.g., virtual ground) and a reference digit line may be driven to a high voltage (e.g., a sensing voltage); the digit lines may then be shorted together via the switching component to produce the voltage at or near the voltage of plate line 210-*a*.

Digit lines 115-*b* to 115-*e* may also be in electronic communication with sensing components 125-*b* to 125-*e*, respectively. Sensing components 125-*b* to 125-*e* may be used to determine the stored state of corresponding ferroelectric memory cells 105-*b* to 105-*e*. In some cases, each of sensing components 125-*b* to 125-*e* may be or may include a sense amplifier. Sensing components 125-*b* to 125-*e* may be operated by a voltage source associated with a low voltage (e.g., virtual ground, a negative voltage, etc.) and voltage source associated with a higher voltage (e.g., a positive voltage, a sensing voltage, etc.). Sensing components 125-*b* to 125-*e* may be used to determine a logic value of the corresponding ferroelectric memory cell 105-*b* to 105-*e* based at least in part on the voltage of the corresponding digit lines 115-*b* to 115-*e* and the voltage of a reference line (e.g., reference line 225 as discussed with reference to FIG. 2). In some examples, sensing components 125-*b* to 125-*e* are activated, which may be referred as being "fired," to trigger a comparison between the voltage of digit line 115-*b* and the voltage of the reference line. Sensing components 125-*b* to 125-*e* may latch the output of a sense amplifier to the voltage provided by either the high or the low voltage. For instance, if the voltage of digit line 115-*b* is greater than the reference voltage, then sensing component 125-*b* may latch the output of the sense amplifier at a positive voltage supplied from the higher voltage source.

In some examples, sensing components 125-*b* to 125-*e* may be associated with sets of sensing components. For instance, sensing component 125-*b* may be associated with a first set, sensing component 125-*c* with a second set, sensing component 125-*d* with a third set, and sensing component 125-*e* with a fourth set. Sensing components 125 from the sets may then be arranged in an interleaved pattern to reduce pattern noise. For example, sensing components from the first set (e.g., sensing component 125-*b*) may be adjacent to sensing components from the second set (e.g., sensing component 125-*c*) and the fourth set (e.g., sensing component 125-*e*), sensing components from the second set (e.g., sensing component 125-*b*) may be adjacent to sensing components from the first set (e.g., sensing component 125-*b*) and the third set (e.g., sensing component 125-*d*), etc. In other examples, sensing components 125-*b* and 125-*d* may be associated with a first set, while sensing components 125-*c* and 125-*e* may be associated with a second set. Similarly sensing components of the first set may be interleaved with sensing components of the second set.

Memory controller 140-*a* may use control lines 415-*a* to 415-*d* to carry signals for activating/deactivating switching components 405-*a* to 405-*d*, plate switching components 410-*a* to 410-*d*, and sensing components 125-*b* to 125-*e*. In some examples, plate switching components 410-*a* to 410-*d* may be optionally implemented in example circuit 400. Each control line 415 may be associated with multiple control lines. For instance, control line 415-*a* may include a first control line used to activate/deactivate sensing component 125-*b*, a second control line to activate/deactivate switching component 405-*a*, and a third control line to activate/deactivate switching component 410-*a*. In some cases, control lines 415-*a* and 415-*c* may share a common node and control lines 415-*b* and 415-*d* may also share a common node. That is, if a voltage is applied to control line 415-*a*, that same voltage may also be applied to control line 415-*c*, and if a voltage is applied to control line 415-*b*, that same voltage may also be applied control line 415-*d*. In this way, memory controller 140-*a* may independently activate sensing components 125-*b* to 125-*e* in an interleaved fashion. For example, sensing components 125-*b* and 125-*d* may be activated while sensing components 125-*c* and 125-*e* are deactivated. In examples where each control line 415-*a* to 415-*d* is independent of one another, memory controller 140-*a* may activate sensing components (e.g., sensing component 125-*b*) from one sensing component set, while sensing components (e.g., sensing component 125-*c* to 125-*e*) from each of the other sensing component sets are deactivated.

In certain examples, a subset of the information stored by ferroelectric memory cells 105-*b* to 105-*e* may be used by a program (e.g., software application, hardware driver, etc.) that triggers a read operation. But to select any of ferroelectric memory cells 105-*b* to 105-*e*, a voltage may be applied to word line 110-*b*, and as discussed above, applying a voltage to word line 110-*b* may result in a conductive path being established between the ferroelectric capacitors of each of ferroelectric memory cells 105-*b* to 105-*e* and the corresponding digit line 115-*b* to 115-*e*. Due to the properties of a ferroelectric capacitor, the ferroelectric capacitors of ferroelectric memory cells 105-*b* to 105-*e* may not discharge onto digit lines 115-*b* to 115-*e* if a voltage that is at or near the voltage applied to plate line 210-*a* is also present on the digit lines 115-*b* to 115-*e*. Therefore, memory controller 140-*a* may virtually ground a first subset of digit lines 115-*b* to 115-*e* and activate the corresponding first subset of sensing components 125-*b* to 125-*e*, where the first digit lines subset corresponds to a first subset of ferroelectric memory cells 105-*b* to 105-*e* requested by the read operation. The memory controller may maintain other digit line subset(s) at or near the plate voltage and other sensing components subset(s) in a deactivated state during the read operation, conserving power.

In some cases, ferroelectric memory cells 105-*b* and 105-*d* may correspond to a first set of ferroelectric memory cells, ferroelectric memory cells 105-*c* and 105-*e* may correspond to a second set of ferroelectric memory cells. In other cases, ferroelectric memory cell 105-*b* may correspond to a first set of ferroelectric memory cells, ferroelectric memory cell 105-*c* may correspond to a second set of ferroelectric memory cells, etc. In some examples, switching components 405-*a* to 405-*d* are referred to as linear equalization devices. Switching components 405-*a* to 405-*d* and plate switching components 410-*a* to 410-*d* may be implemented as transistors (e.g., an n or p-type FET) and may be activated/deactivated by applying increasing or reducing a control signal, or an amplified version of the control signal, to a gate of the transistor. In some examples, switching components 405 and 410 may be implemented as a single device (e.g., a single pole double throw switch). Circuit 400 may also include external/internal voltage source(s), amplifier(s), or line driver(s), which may be used to apply voltages to plate line 210-*a*, word line 110-*a*, switching component 405, and/or switching components 410.

Figure 5:
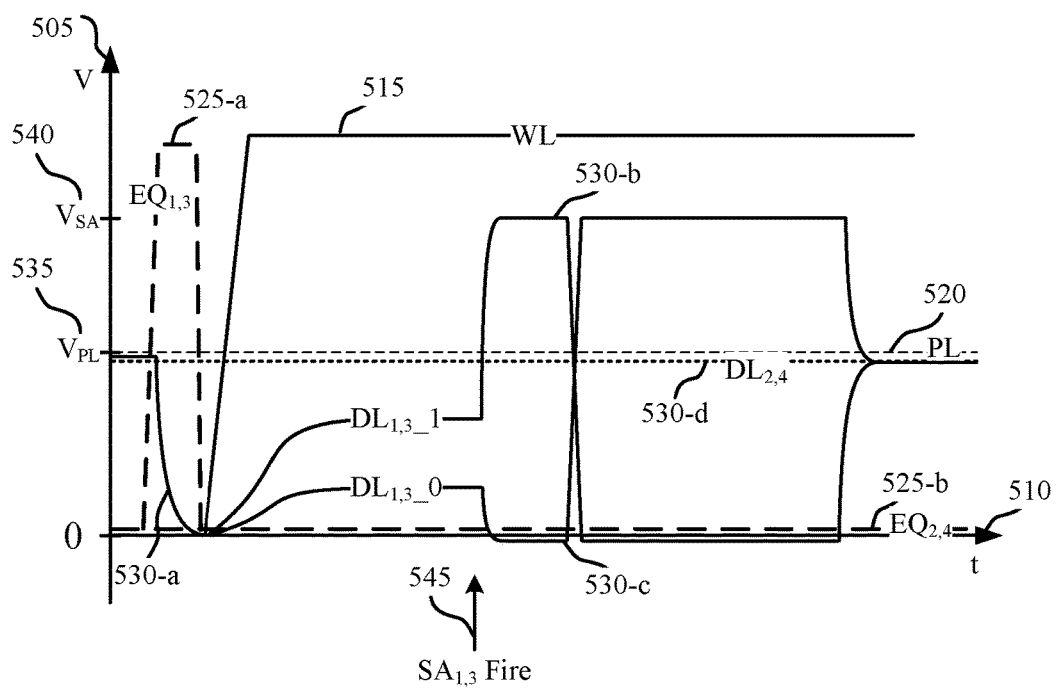
FIG. 5 illustrates a timing diagram for a reduced-power sensing scheme in accordance with various embodiments of the present disclosure.

FIG. 5 illustrates a timing diagram 500 for a reduced power sensing scheme in accordance with various embodiments of the present disclosure. Timing diagram 500 depicts voltage on axis 505 and time on axis 510. The voltage of various components as a function of time may thus be represented on timing diagram 500. For example, timing diagram 500 includes word line voltage 515, plate line voltage 520, equalization voltages 525-*a* and 525-*b*, and digit line voltages 530-*a* and 530-*b*. Timing diagram 500 may also include fixed voltage 535, sensing voltage 540, and firing time 545. Timing diagram 500 depicts an example operation of circuit 400 described with reference to FIG. 4. FIG. 5 is described below with reference to components of preceding figures. Voltages that approach zero may be offset from axis 510 for ease of representation; in some cases, these voltages may be equal to or approximately equal to zero.

As discussed with reference to FIG. 4, the digit line voltages 530 for each digit line 115-*b* to 115-*e* may be at or near fixed voltage 535, where fixed voltage 535 may associated with a constant voltage that is applied to plate line 210-a. In some cases, ferroelectric memory cells 105-b and 105-d may correspond to a first set of ferroelectric memory cells and ferroelectric memory cells 105-c and 105-e may correspond to a second set of ferroelectric memory cells. In the example of FIG. 5, the first set of ferroelectric memory cells 105-b and 105-d and the second set of ferroelectric memory cells 105-c and 105-e may be selected for a read operation. A device may determine that the program triggering the read operation has only requested the information stored by the first set of ferroelectric memory cells 105-b and 105-d. Accordingly, in preparation for the read operation, memory controller 140-a may apply equalization voltage 525-a to a first set of switching components 405-a and 405-c, driving the digit line voltage 530-a toward virtual ground. Digit line voltage 530-a may be associated with a first set of digit lines 115-b and 115-d. Memory controller 140-a may concurrently remove a voltage applied to plate switching components 410-a and 410-c to isolate the first set of digit lines 115-b and 115-d from plate line 210-a.

Memory controller 140-a may concurrently maintain the equalization voltage 525-b applied to a second set of switching components 405-b and 405-d and may also maintain the maintain the voltage applied to plate switching components 410-b and 410-d maintaining the connection between plate line 210-a and digit lines 115-c and 115-e. As a result, digit line voltage 530-d may remain at or near fixed voltage 535. Digit line voltage 530-d may be associated with a second set of digit lines 115-c and 115-e. Once digit line voltage 530-a has reached or is near virtual ground, equalization voltage 525-a may be removed, causing a voltage of the second set of digit lines 115-b and 115-d to change based on other fluctuations in the circuit 400, and word line voltage 515 may be applied to word line 110-b. A digit line, or other component that is disconnected from a specific voltage source, and thus susceptible to changes in voltage caused by other fluctuations in the circuit may be said to "float" or be "floating." A circuit element that is isolated from other elements may be referred to as floating.

Applying word line voltage 515 may establish a conductive path between the cell bottom (e.g., cell bottom 215 as described with reference to FIG. 2) associated with a ferroelectric capacitor of each ferroelectric memory cell 105-b to 105-e and each digit line 115-b to 115-e, respectively. As digit line voltage 530-d and plate voltage 520 have been maintained at or near fixed voltage 535, a zero voltage may be applied across the ferroelectric capacitors of the second set of ferroelectric memory cells 105-c and 105-e. Accordingly, the ferroelectric capacitors of the second set of ferroelectric memory cells 105-c and 105-e may refrain from charge sharing with the second set of digit lines 115-c and 115-e and may maintain their initial storage state. Conversely, as the digit line voltage 530-a associated with the first set of digit lines 115-b and 115-d has been driven to ground and subsequently floated, the fixed voltage 535 may be applied across the ferroelectric capacitors associated with the first set of ferroelectric memory cells 105-b and 105-d. Accordingly, the digit line voltage 530-a may rise as the ferroelectric capacitors of the first set of ferroelectric memory cells 105-b and 105-d discharge onto the first set of digit lines 115-b and 115-d.

In the example depicted in FIG. 5, digit line voltage 530-a may rise to one of two voltages based on the stored state. For instance, if a logic "1" is stored by a ferroelectric capacitor of ferroelectric memory cell 105-b, then digit line voltage 530-b may result, while digit line voltage 530-c may result if a logic "0" is stored. Digit line voltage 530-b may be associated with a smaller voltage drop over the ferroelectric cell and therefore a higher digit line voltage when compared with digit line voltage 530-c, as can be seen with respect to FIG. 3. After digit line voltage 530-b or 530-c has settled, the first set of sensing components 125-b and 125-d may be activated at firing time 545. The first set of sensing components 125-b and 125-d may compare the digit line voltage 530 with a reference voltage and the output of the sensing components may be latched, accordingly. For instance, if a logic value "1" is stored by the ferroelectric capacitor associated with ferroelectric memory cell 105-b, then the sensing component 125-b may compare digit line voltage 530-b with the reference voltage and may determine the digit line voltage 530-b is higher than the reference voltage. Therefore, the output of the sensing component 125-b may be driven to a positive supply voltage and latched. In the example depicted in FIG. 5, the digit line 115-b may also be driven to the output of sensing component 125-b.

As discussed above, in some examples only the information stored by the first set of ferroelectric memory cells 105-b and 105-d is to be used, and therefore, the second set of sensing components 125-c and 125-e that correspond to the second set of ferroelectric memory cells 105-c and 105-e may be maintained in a deactivated state during the read operation. Activating (or firing) a portion of the sensing components 125 may conserve power during read operations. After firing the first set of sensing components 125-b and 125-d, a write-back procedure may be performed to restore the logic states stored by the first set of ferroelectric memory cells 105-b and 105-d prior to the read operation.

In some cases, the write-back procedure may include an opposite write-back procedure during which the opposite state to the previously stored state is written-back to a sensed ferroelectric memory cell 105. After write-back, the first set of digit lines 115-b and 115-d may be returned to or near fixed voltage 535 in preparation of the next read operation. Returning the voltage of the first set of digit lines 115-b and 115-d to fixed voltage 535 may include shorting the first set of digit lines 115-b and 115-d to plate line 210-a. In some cases, a first set of plate switching components 410-a and 410-c may be activated to short the first set of digit lines 115-b and 115-d to plate line 210-a. Alternatively, the first set of digit lines 115-b and 115-d may be driven to a high or low voltage based on the sensing operation and subsequently shorted with the corresponding reference line, which has been driven to the opposite voltage, to produce a voltage in between the high and low voltages (i.e., a voltage at or near fixed voltage 535).

In some examples, ferroelectric memory cells 105-b to 105-e may further be broken down so that ferroelectric memory cell 105-b corresponds to a first set of ferroelectric memory cells, ferroelectric memory cell 105-c corresponds to a second set of ferroelectric memory cells, etc. In this way, control over which sensing components 125-b to 125-e may be activated/deactivated during a read with increased granularity. In some cases, the rise and fall of certain voltages may overlap with one another to reduce the duration associated with read/write operations. For instance, in one case, the rise of word line voltage 515 may overlap with the descent of equalization voltage 525-a. Applying voltages, such as equalization voltage 525-a, to a switching component, such as switching components 405 and 410, may activate a switching component and removing a voltage (e.g., applying a zero voltage) may deactivate a switching component.

Although, some switching components may be implemented that operate conversely—i.e., applying a voltage deactivates the switching component.

Figure 6:
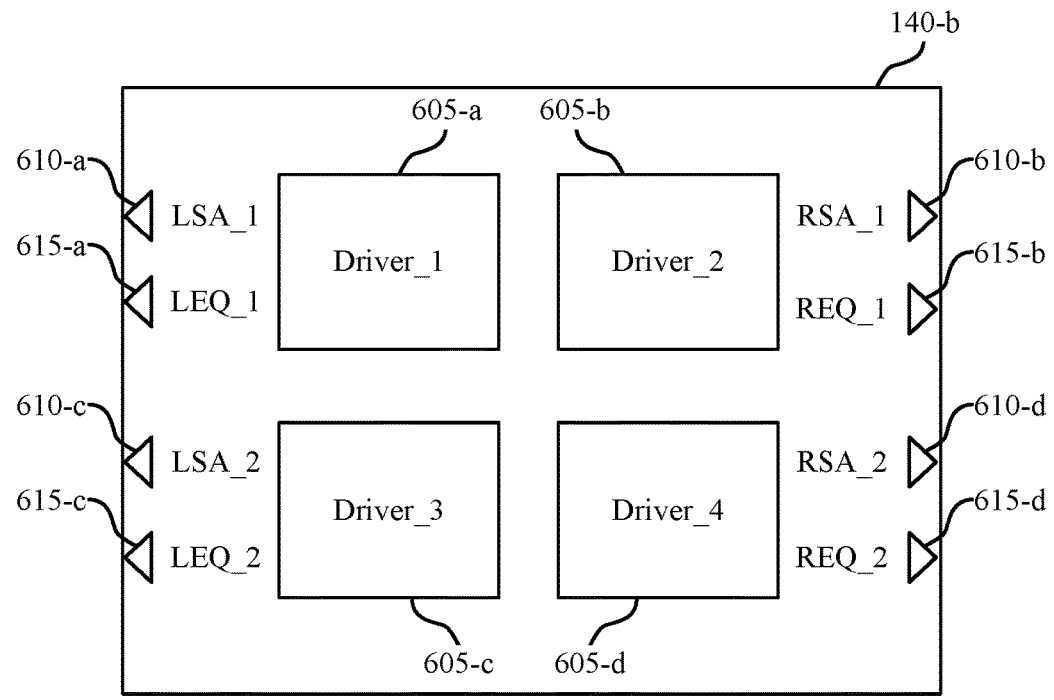
FIG. 6 illustrates an example memory controller for a reduced-power sensing scheme in accordance with various embodiments of the present disclosure.

FIG. 6 illustrates a block diagram 600 of an example memory controller 140-b for a reduced power sensing scheme in accordance with various embodiments of the present disclosure. Memory controller 140-b includes drivers 605, sensing outputs 610, and equalization outputs 615. Sensing outputs 610 may include left sensing outputs 610-a and 610-c and right sensing outputs 610-b and 610-d. Equalization outputs 615 may include left equalization outputs 615-a and 615-c and right equalization outputs 615-b and 615-d. Driver 605-a may be used to control left sensing output 610-a and left equalization output 615-a. Driver 605-b may be used to control right sensing output 610-b and right equalization output 615-b. Driver 605-c may be used to control left sensing output 610-c and left equalization output 615-c. Driver 605-d may be used to control right sensing output 610-d and right equalization output 615-d.

As discussed with reference to FIG. 4, driver 605-a may be used to apply a voltage through left sense output 610-a to sensing component 125-b; driver 605-b may apply a voltage through right sense output 610-b to sensing component 125-c; driver 605-c may apply a voltage through left sense output 610-c to sensing component 125-d; and driver 605-d may apply a voltage through right sense output 610-d to sensing component 125-e. Similarly, driver 605-a may be used to apply a voltage through left equalization output 615-a to switching component 405-a and plate switching component 410-a; driver 605-b may apply a voltage through right equalization output 610-b to switching component 405-b and plate switching component 410-b; driver 605-c may apply a voltage through left equalization output 615-c to switching component 405-c and plate switching component 410-c; and driver 605-d may apply a voltage through right equalization output 615-d to switching component 405-d and plate switching component 410-d.

In some cases, the drivers 605 may be used to amplify a low voltage control signal that originates in memory controller 140-b, from a microcontroller for instance. In some cases, the control voltage may be amplified to produce a voltage that is capable of driving to a gate of a transistor used to implement a switching component. In some examples, the drivers 605 operate similarly but are implemented externally to controller 140-b.

In some cases, driver 605-c and 605-d, left and right sense output 610-c and 610-d, and left and right equalization output 615-c and 615-d may not be implemented. For instance, as discussed with reference to FIG. 4, ferroelectric memory cells 105-b to 105-e may correspond to a first and second set of memory devices. So memory controller 140-b may use driver 605-a to activate a first set of sensing components 125-b and 125-d through left sense output 610-a, and switching components 405-a and 405-c and plate switching components 410-a and 410-c through left equalization output 610-a. While driver 605-b may be used to activate a second set of sensing components 125-c and 125-e through right sense output 610-b, and switching components 405-b and 405-d and plate switching components 410-b and 410-d through right equalization output 610-b. Furthermore, control lines 415-a and 415-c may be connected at a common node (e.g., at left sense output 610-a and left equalization output 615-a) and control line 415-b and 415-d may also be connected at a common node (e.g., at right sense output 610-b and right equalization output 615-b).

Figure 7:
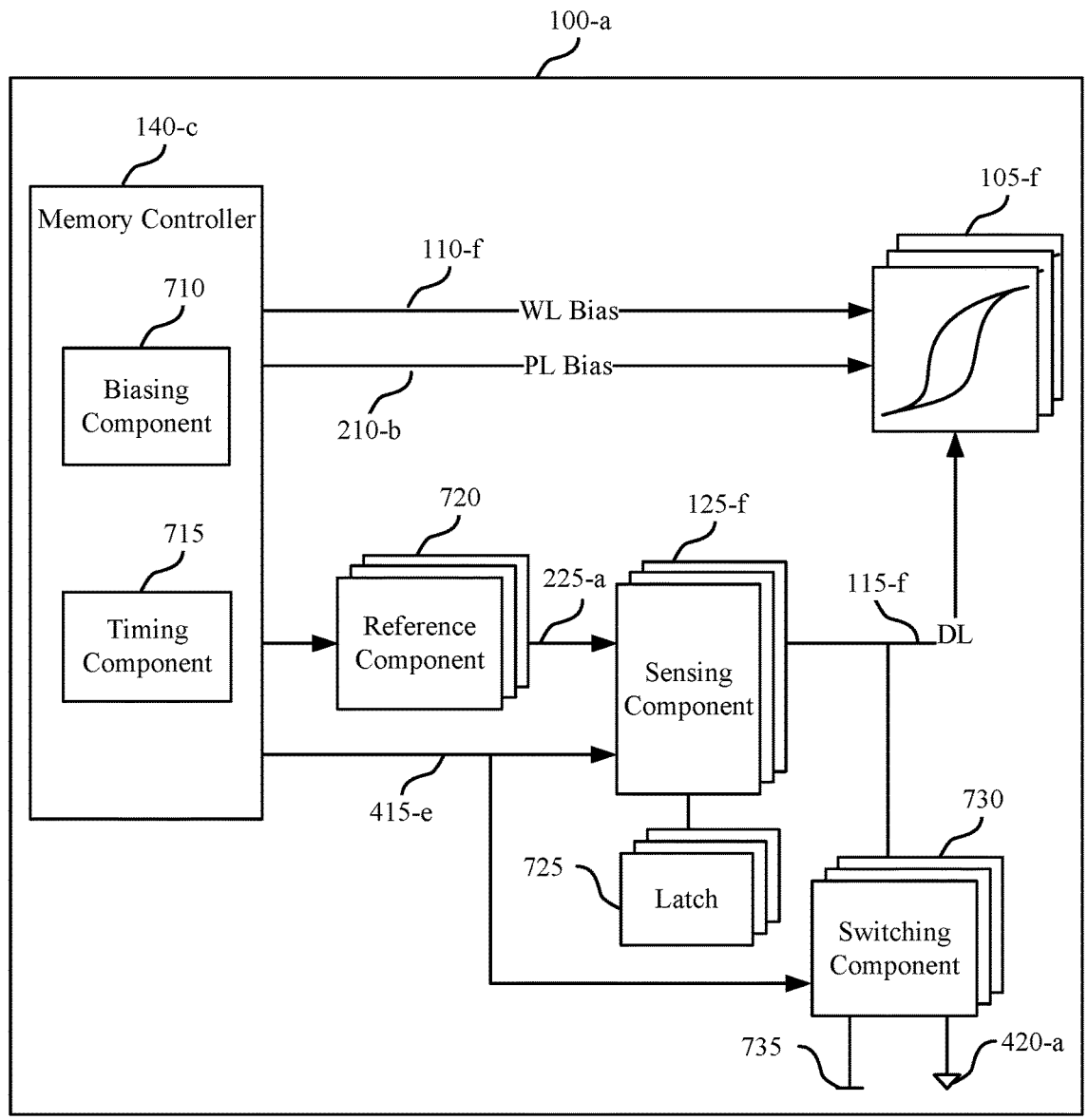
FIG. 7 illustrates a block diagram of an example ferroelectric memory array that supports a reduced-power sensing scheme in accordance with various embodiments of the present disclosure.

FIG. 7 illustrates a block diagram 700 of a memory array 100-a that supports a reduced power sensing scheme in accordance with various embodiments of the present disclosure. Memory array 100-a may be referred to as an electronic memory apparatus and includes memory controller 140-c and memory cells 105-f, which may be examples of memory controller 140 and memory cell 105 described with reference to FIGS. 1, 2, 4, and 6. Memory cells 105-f may include a first, second, third, and fourth set of memory cells that may correspond to a first, second, third, and fourth set of sensing components 125-f as discussed with reference to FIGS. 4-6. Each sensing component 125-f of the first set of sensing components may be in electronic communication with a respective memory cell 105-f of the first set of memory cells, and each sensing component 125-f of the second set of sensing components may be in electronic communication with a respective memory cell 105-f of the second set of memory cells. Digit lines 115-f may include a first, second, third, and fourth set of digit lines that correspond to a memory cell 105-f and sensing component 125-f of the first, second, third, and fourth sets of memory cells and sensing components as discussed with reference to FIGS. 4-6.

Memory controller 140-c may be operable to activate the first set of sensing components 125-f, the second set of sensing components 125-f, the third set of sensing components 125-f, the fourth set of sensing components 125-f, or any combination thereof. Memory controller 140-c may include biasing component 710 and timing component 715 and may operate memory array 100-a as described in FIGS. 1-6. Memory controller 140-c may be in electronic communication with word line 110-f, digit line 115-f, sense component 125-f, and plate line 210-b, which may be examples of word line 110, digit line 115, sense component 125, and plate line 210 described with reference to FIGS. 1, 2, and 4. Biasing component 710 may include or be in electronic communication with drivers (e.g., amplifiers, gate drivers, etc.) for applying voltages to other components within memory array 100-a. In some cases, memory controller 140-c includes a first driver that is in electronic communication with the first set of sensing components, and a second driver that is in electronic communication with the second set of sensing components. Each sensing component 125-f of the first set of sensing components may be in electronic communication with memory controller 140-c via a first control line 415-e, and each sensing component 125-f of the second set of sensing components may be in electronic communication with memory controller 140-c via a second control line 415-e.

Memory array 100-a may also include reference component 720, latch 725, switching component 730, and fixed voltage 735. The components of memory array 100-a may be in electronic communication with each other and may perform the functions described with reference to FIGS. 1-6. In some cases, reference component 720, sense component 125-f and latch 725 are components of memory controller 140-c. Switching component 730, reference component 720, and latch may include first, second, third, and fourth sets of equalization components, reference components, and latches, respectively, as described with respect to FIGS. 4-6. In some cases, the first set of sensing components and the second set of sensing components are arranged in an interleaved pattern that comprises a first sensing component of the first set of sensing components 125-f adjacent to a first sensing component and a second sensing component of the second set of sensing components 125-f. This may be further applied to the third and fourth set of sensing components 125-f—i.e., a sensing component of the first set may be adjacent to a sensing component of the fourth and second set, a sensing component of the second set may be adjacent to a sensing component of the first and third set, etc. Interleaving the sensing components 125-f may reduce pattern noise between digit lines 115-f.

In some examples, digit line 115-f is in electronic communication with virtual ground 420-a, sense component 125-f, and a ferroelectric capacitor of memory cells 105-f Word line 110-f may be in electronic communication with memory controller 140-c and a selection component of memory cells 105-f. Plate line 210-b may be in electronic communication with memory controller 140-c and a plate of a ferroelectric capacitor for each of the first, second, third, and/or fourth sets of memory cells 105-f. Sense component 125-f may be in electronic communication with memory controller 140-c, reference line 225-a, digit line 115-f, and latch 725. Reference component 720 may be in electronic communication with memory controller 140-c and reference line 225-a. Switching component 730 may be in electronic communication with memory controller 140-c and digit line 115-f. Virtual ground 420-a may be in electronic communication with memory controller 140-c, digit line 115-f, and virtual ground 420-a. These components may also be in electronic communication with other components, both inside and outside of memory array 100-a, not listed above, via other components, connections, or busses.

Memory controller 140-c may be configured to activate word line 110-f, plate line 210-b, or digit line 115-f by applying voltages to those various nodes. For example, biasing component 710 may be configured to apply a voltage to operate memory cells 105-f to read or write memory cells 105-f as described above. In some cases, memory controller 140-c may include a row decoder, column decoder, or both, as described with reference to FIG. 1. This may enable memory controller 140-c to access one or more memory cells 105. Biasing component 710 may also provide voltage potentials to reference component 720 in order to generate a reference signal for sense component 125-f. Additionally, biasing component 710 may provide voltage potentials for the operation of sense component 125-f. In some cases, memory controller 140-c may perform its operations using timing component 715. For example, timing component 715 may control the timing of the various word line selections or plate biasing, including timing for switching and voltage application to perform the memory functions, such as reading and writing, discussed herein. In some cases, timing component 715 may control the operations of biasing component 710.

Switching component 730 may include switching components (e.g., switching components 405 and plate switching components 410 as described with reference to FIG. 4) to isolate/establish conductive paths between digit line 115-f and fixed voltage 735 or virtual ground 420-a. In some cases, a voltage of plate line 210-b may be at or near fixed voltage 735. In other cases, fixed voltage 735 and plate line 210-b may be connected at a common node. Switching component 730 may include a first set of switching components 730 in electronic communication with a digit line 115-f associated with each memory cell 105-f of the first set of memory cells and the plate line 210-b, and a second set of switching components 730 in electronic communication with a digit line 115-f associated with each memory cell 105-f of the second set of memory cells and the plate line 210-b. Each switching component of the first set of switching components is in electronic communication with the controller via a first control line, and wherein each switching component of the second set of switching components is in electronic communication with the controller via a second control line. Sense component 125-f may compare a signal from memory cells 105-f (through digit line 115-f) with a reference signal from reference component 720. Upon determining the logic state, the sense component may then store the output in latch 725, where it may be used in accordance with the operations of an electronic device that memory array 100-a is a part.

In some cases, memory controller 140-c may use biasing component 710 to select the first set of memory cells 105-f and the second set of memory cells 105-f for a read operation using word line 110-f that is in electronic communication with the first set of memory cells 105-f and the second set of memory cells 105-f. Memory controller 140-c may also use biasing component 710 activate the first set of sensing components 125-f corresponding to the first set of memory cells 105-f for the read operation and refrain from using biasing component 710 to maintain the second set of sensing components 125-f corresponding to the second set of memory cells 105-f in a deactivated state during the read operation.

Memory controller 140-c may utilize a first driver in combination with biasing component 710 to short a digit line for each memory cell of the second set of memory cells with a plate line during the read operation, wherein the plate line is associated with the first set of memory cells and the second set of memory cells. Memory controller 140-c may utilize a second driver in combination with biasing component 710 to isolate a digit line for each memory cell of the first set of memory cells from the plate line during the read operation. In some cases, may use biasing component 710 to activate switching component 730 during the read operation, where the first set of digit lines 115-f associated with the first set of memory cells 105-f are in electronic communication with a plate line via switching component 730. Memory controller 140-c may also use biasing component 710 to deactivate switching component 730 during the read operation, where the second set of digit lines 115-f associated with each ferroelectric memory cell 105-f of the second set of memory cells 105-f is in electronic communication with a plate line 210-b via switching component 730.

Memory controller 140-c may use biasing component 710 to select the third set of ferroelectric memory cells 105-f and the fourth set of ferroelectric memory cells 105-f using word line 110-f. Memory controller 140-c may also use biasing component 710 to activate the third set of sensing components 125-f for the read operation.

Figure 8:
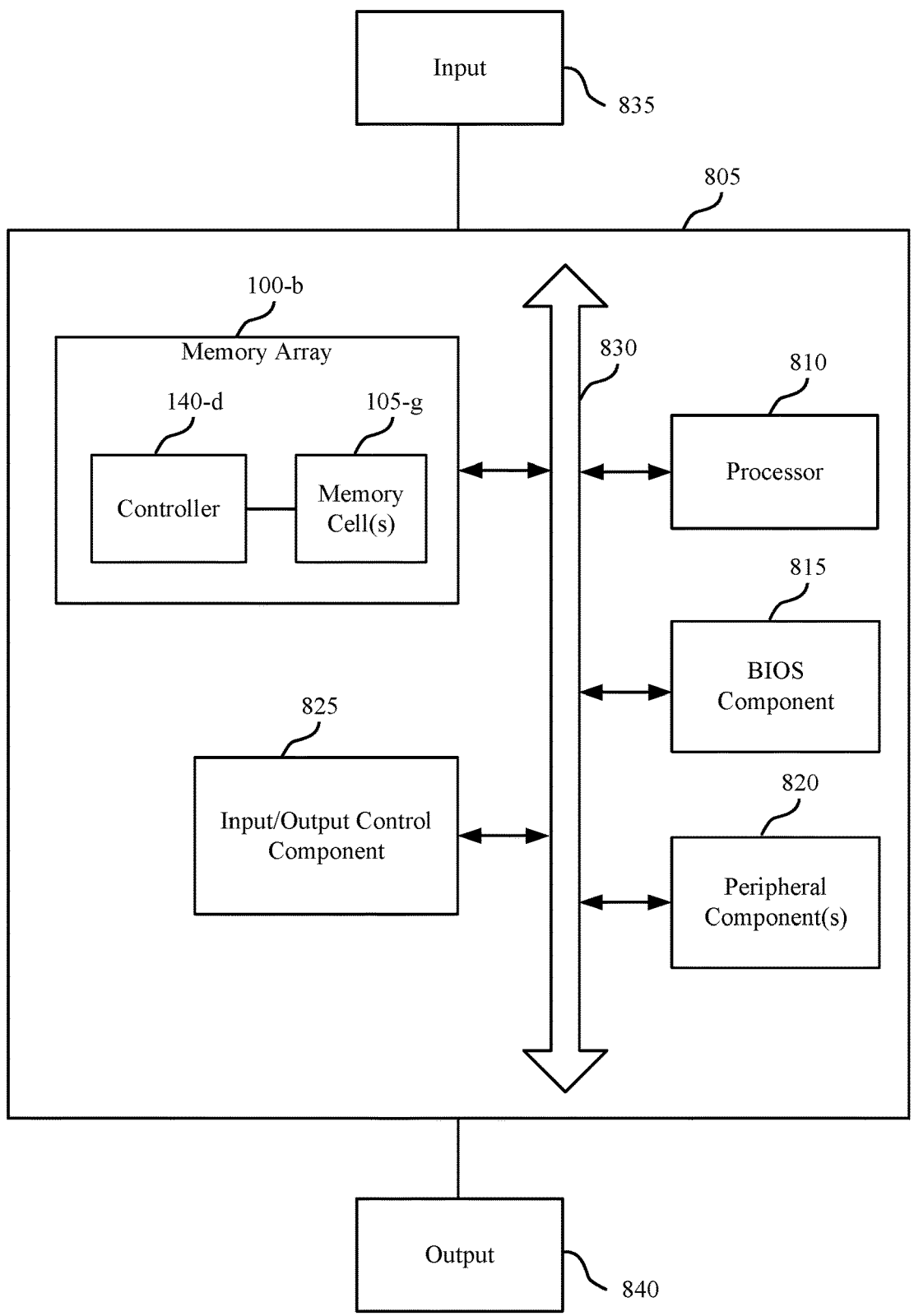
FIG. 8 illustrates a block diagram of a device, including a memory array, that supports a reduced-power sensing scheme in accordance with various embodiments of the present disclosure.

FIG. 8 illustrates a system 800 that supports a reduced power sensing scheme in accordance with various embodiments of the present disclosure. System 800 includes a device 805, which may be or include a printed circuit board to connect or physically support various components. Device 805 includes a memory array 100-b, which may be an example of memory array 100 described with reference to FIG. 1 and FIG. 7. Memory array 100-b may contain memory controller 140-d and memory cell(s) 105-g, which may be examples of memory controller 140 described with reference to FIGS. 1 and 7 and memory cells 105 described with reference to FIGS. 1, 2, 4, and 7. Device 805 may also include a processor 810, BIOS component 815, peripheral component(s) 820, and input/output control component 825. The components of device 805 may be in electronic communication with one another through bus 830.

Processor 810 may be configured to operate memory array 100-b through memory controller 140-d. In some cases, processor 810 may perform the functions of memory controller 140 described with reference to FIGS. 1, 4, 6, and 7. In other cases, memory controller 140-d may be integrated into processor 810. Processor 810 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 810 may perform various functions described herein, including a reduced power sensing scheme. Processor 810 may, for example, be configured to execute computer-readable instructions stored in memory array 100-b to cause device 805 perform various functions or tasks.

BIOS component 815 may be a software component that includes a basic input/output system (BIOS) operated as firmware, which may initialize and run various hardware components of system 800. BIOS component 815 may also manage data flow between processor 810 and the various components, e.g., peripheral components 820, input/output control component 825, etc. BIOS component 815 may include a program or software stored in read-only memory (ROM), flash memory, or any other non-volatile memory.

Peripheral component(s) 820 may be any input or output device, or an interface for such devices, that is integrated into device 805. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 825 may manage data communication between processor 810 and peripheral component(s) 820, input devices 835, or output devices 840. Input/output control component 825 may also manage peripherals not integrated into device 805. In some cases, input/output control component 825 may represent a physical connection or port to the external peripheral.

Input 835 may represent a device or signal external to device 805 that provides input to device 805 or its components. This may include a user interface or interface with or between other devices. In some cases, input 835 may be a peripheral that interfaces with device 805 via peripheral component(s) 820 or may be managed by input/output control component 825.

Output 840 may represent a device or signal external to device 805 configured to receive output from device 805 or any of its components. Examples of output 840 may include a display, audio speakers, a printing device, another processor or printed circuit board, etc. In some cases, output 840 may be a peripheral that interfaces with device 805 via peripheral component(s) 820 or may be managed by input/output control component 825.

The components of memory controller 140-d, device 805, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 9:
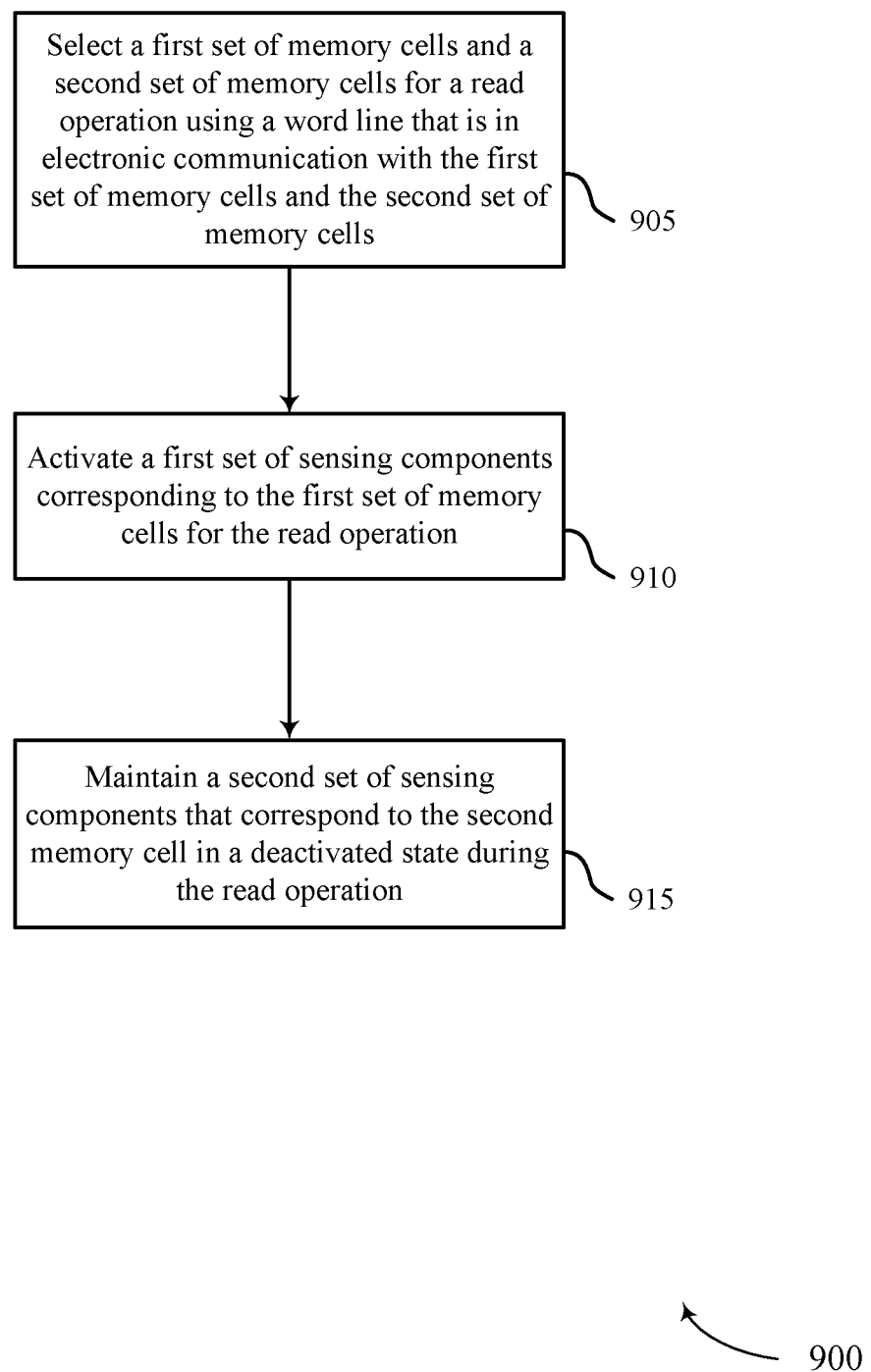
FIG. 9 is a flowchart that illustrates a method or methods for a reduced-power sensing scheme in accordance with various embodiments of the present disclosure.

FIG. 9 shows a flowchart illustrating a method 900 for a reduced power sensing scheme in accordance with various embodiments of the present disclosure. The operations of method 900 may be implemented by a memory array 100, as described with reference to FIGS. 1-8. For example, the operations of method 900 may be performed by a memory controller 140 as described with reference to FIGS. 1, 4, and 6-8. In some examples, a memory controller 140 may execute a set of codes to control the functional elements of the memory array 100 to perform the functions described below. Additionally or alternatively, the memory controller 140 may perform features the functions described below using special-purpose hardware.

At block 905, the method may include selecting a first set of memory cells and a second set of memory cells for a read operation using a word line that is in electronic communication with the first set of memory cells and the second set of memory cells. In certain examples, the operations of block 905 may be performed or facilitated by the biasing component 710, as described with reference to FIG. 7. In some examples, the word line is in electronic communication with a third set of memory cells and a fourth set of memory cells, and the method may further include selecting the third set of memory cells and the fourth set of memory cells using the word line.

At block 910, the method may include activating a first set of sensing components corresponding to the first set of memory cells for the read operation. In certain examples, the operations of block 910 may be performed or facilitated by the biasing component 710, as described with reference to FIG. 7. In some cases, the method may include isolating a digit line for each memory cell of the first set of memory cells from a plate line during the read operation. Isolating the digit line for each memory cell may include deactivating a switching component that is in electronic communication with the plate line and the digit line for each memory cell of the first set of memory cells during the read operation. In some examples, a third set of sensing components is in electronic communication with the third set of memory cells and a fourth set of sensing components is in electronic communication with the fourth set of memory cells.

In some cases, the method may include providing a voltage to the digit line for each memory cell of the first set of memory cells before the read operation. The voltage may be equivalent to (e.g., at or near) the voltage of the plate line. In some cases, providing a voltage to the digit line for each memory cell of the first set of memory cells may include shorting the digit line for each memory cell of the first set of memory cells with a corresponding first set of reference digit lines. In some cases, the method may include virtually grounding the digit line for each memory cell of the first set of memory cells before the read operation and/or after providing a voltage to the digit line for each memory cell of the first set of memory cells.

At block 915, the method may include maintaining a second set of sensing components that correspond to the second memory cell in a deactivated state during the read operation. In certain examples, the operations of block 915 may be performed or facilitated by the biasing component 710, as described with reference to FIG. 7. Each memory cell of the first set of memory cells and each memory cell of the second set of memory cells comprises a ferroelectric capacitor. In some cases, the method may include shorting a digit line for each memory cell of the second set of memory cells with a plate line during the read operation, wherein the plate line is in electronic communication with the first set of memory cells and the second set of memory cells. Shorting the digit line may include activating a switching component that is in electronic communication with the plate line and a digit line for each memory cell of the second set of memory cells during the read operation. In some cases, a voltage of the plate line is a fixed voltage. In some cases, the fourth set of sensing components is maintained in the deactivated state during the read operation based at least in part on activating the third set of memory cells.

In some cases, the method may include providing a voltage to the digit line for each memory cell of the second set of memory cells before the read operation. In some cases, providing a voltage to the digit line for each memory cell of the second set of memory cells may include shorting the digit line for each memory cell of the second set of memory cells with a corresponding second set of reference digit lines. The first set of sensing components and the second set of sensing components may be arranged in an interleaved pattern that comprises a first sensing component of the first set of sensing components adjacent to a first sensing component and a second sensing component of the second set of sensing components.

Thus, method 900 may provide a method of operating a ferroelectric memory array for a reduced power sensing scheme. It should be noted that method 900 describes possible implementations, and the operations and steps may be rearranged or otherwise modified such that other implementations are possible.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk, and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
   selecting a first memory cell coupled with a first digit line and a second memory cell coupled with a second digit line different than the first digit line for an access operation;
   activating a first sense component coupled with the first memory cell; and
   maintaining a second sense component coupled with the second memory cell in a deactivated state concurrently with activating the first sense component.

2. The method of claim 1, further comprising:
   applying a first voltage to a first switching component coupled with the first memory cell in preparation for the access operation.

3. The method of claim 2, further comprising:
   grounding the first digit line coupled with the first memory cell based at least in part on the applying.

4. The method of claim 2, further comprising:
   applying a second voltage to a second switching component coupled with the second memory cell in preparation for the access operation, wherein the first voltage is different than the second voltage.

5. The method of claim 4, further comprising:
   maintaining the second digit line coupled with the second switching component at the second voltage concurrently with activating the first sense component, wherein the second voltage is based at least in part on a fixed plate line voltage common to the first memory cell and the second memory cell.

6. The method of claim 1, comprising:
   comparing a voltage of the first digit line to a voltage of a reference line based at least in part on the activating, wherein the reference line is coupled to the first sense component; and
   determining a logic state of the first memory cell based at least in part on the comparing.

7. The method of claim 6, further comprising:
   activating a word line common to the first memory cell and the second memory cell, wherein activating the first sense component occurs at a fixed elapsed duration after activating the word line.

8. The method of claim 1, wherein information from the first memory cell is requested and information from the second memory cell is unrequested by the access operation.

9. The method of claim 1, wherein the first memory cell comprises a first capacitor and the second memory cell comprises a second capacitor.

10. The method of claim 9, further comprising:
    applying a voltage to a word line coupled with the first memory cell; and
    establishing a conductive path between the first capacitor of the first memory cell and the first digit line based at least in part on the applying.

11. A memory device, comprising:
    a first memory cell coupled with a first sense component;
    a second memory cell coupled with a second sense component; and
    a controller coupled with the first memory cell and the second memory cell, wherein the controller is operable to activate the first sense component while maintaining the second sense component in a deactivated state.

12. The memory device of claim 11, further comprising:
    a first control line coupled between the first sense component and the controller; and
    a second control line coupled between the second sense component and the controller, wherein the first control line is driven by a first driver and the second control line is driven by a second driver.

13. The memory device of claim 12, wherein the controller is operable to apply a first voltage to the first control line and a second voltage to the second control line, wherein the first voltage is different than the second voltage.

14. The memory device of claim 11, further comprising:
a plate line common to the first memory cell and the second memory cell.

15. A memory device, comprising:
a first memory cell;
a second memory cell;
a first sense component;
a second sense component; and
a controller coupled with the first sense component and the second sense component, wherein the controller is operable to:
select the first memory cell in electronic communication with a first digit line and the second memory cell in electronic communication with a second digit line different than the first digit line;
activate the first sense component corresponding to the first memory cell; and
maintain the second sense component corresponding to the second memory cell in a deactivated state concurrently with activating the first sense component.

16. The memory device of claim 15, further comprising:
a first switching component, wherein the controller is operable to apply a first voltage to the first switching component corresponding to the first memory cell.

17. The memory device of claim 15, further comprising:
a second switching component, wherein the controller is operable to apply a second voltage to the second switching component corresponding to the second memory cell and maintain the second digit line coupled with the second switching component at the second voltage concurrently with activating the first sense component.

18. The memory device of claim 15, further comprising:
a first control line coupled to the controller; and
a second control line coupled to the controller, wherein the controller is operable to apply a first voltage to the first control line and a second voltage to the second control line, wherein the first voltage is different than the second voltage.

19. The memory device of claim 15, further comprising:
a reference line corresponding to the first sense component, wherein the controller is operable to compare a voltage of the first digit line to a voltage of the reference line and determine a logic state of the first memory cell based at least in part the voltage of the first digit line.

20. The memory device of claim 15, further comprising:
a word line corresponding to the first memory cell and the second memory cell, wherein the controller is operable to activate the word line, and wherein activating the first sense component occurs at a fixed time duration after activating the word line.

* * * * *